(12) United States Patent
Lee et al.

(10) Patent No.: US 11,282,872 B2
(45) Date of Patent: Mar. 22, 2022

(54) LASER APPARATUS AND MANUFACTURING METHOD OF DISPLAY APPARATUS USING THE SAME

(71) Applicant: Samsung Display Co., Ltd., Yongin-si (KR)

(72) Inventors: Dong-Min Lee, Yongin-si (KR); Ji-Hwan Kim, Hwaseong-si (KR); Jongoh Seo, Seoul (KR); Byung Soo So, Yongin-si (KR); Dong-Sung Lee, Hwaseong-si (KR); Jonghoon Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/808,157

(22) Filed: Mar. 3, 2020

(65) Prior Publication Data

US 2020/0328237 A1    Oct. 15, 2020

(30) Foreign Application Priority Data

Apr. 12, 2019   (KR) .......................... 10-2019-0043105

(51) Int. Cl.
| | | |
|---|---|---|
| *G02B 27/14* | (2006.01) | |
| *H01L 27/12* | (2006.01) | |
| *H01L 21/02* | (2006.01) | |
| *B23K 26/53* | (2014.01) | |
| *H01S 3/00* | (2006.01) | |
| *G02B 27/12* | (2006.01) | |

(52) U.S. Cl.
CPC .......... *H01L 27/1281* (2013.01); *B23K 26/53* (2015.10); *G02B 27/126* (2013.01); *H01L 21/02675* (2013.01); *H01S 3/005* (2013.01); *H01S 3/0071* (2013.01); *H01L 21/02532* (2013.01)

(58) Field of Classification Search
CPC .......................... B23K 26/0006; B23K 26/083; B23K 26/352; B23K 26/53; B23K 26/0876; B23K 2101/40; B23K 2103/56; H01S 3/0071; H01S 3/225; H01S 3/005; G02B 27/126; H01L 21/02675; H01L 21/02532; H01L 27/1281
See application file for complete search history.

(56) References Cited

U.S. PATENT DOCUMENTS

| | | | | |
|---|---|---|---|---|
| 5,153,773 | A | * 10/1992 | Muraki | ................ G02B 3/0056 |
| | | | | 359/211.1 |
| 2008/0158638 | A1 | * 7/2008 | Furuya | ...................... G02F 1/37 |
| | | | | 359/237 |
| 2017/0075124 | A1 | * 3/2017 | So | ........................ G02B 17/008 |

FOREIGN PATENT DOCUMENTS

| | | |
|---|---|---|
| CN | 110387532 A | 10/2019 |
| KR | 10-1389722 B1 | 4/2014 |

(Continued)

*Primary Examiner* — Mark Hellner
(74) *Attorney, Agent, or Firm* — Lewis Roca Rothgerber Christie LLP (57) ABSTRACT

A laser apparatus includes a laser generator configured to generate a first laser beam proceeding along a first direction, and an inversion module configured to convert the first laser beam to a second laser beam proceeding along the first direction, the inversion module including a splitter configured to form a reflected laser beam by partially reflecting the first laser beam, and a transmitted laser beam by partially transmitting the first laser beam, and a prism configured to reflect the reflected laser beam.

10 Claims, 7 Drawing Sheets

(56) References Cited

FOREIGN PATENT DOCUMENTS

| KR | 10-2016-0105610 A | 9/2016 |
| KR | 10-2017-0018347 A | 2/2017 |
| KR | 10-2017-0032944 A | 3/2017 |
| KR | 10-2019-0121893 A | 10/2019 |

* cited by examiner

LASER APPARATUS AND MANUFACTURING METHOD OF DISPLAY APPARATUS USING THE SAME

CROSS-REFERENCE TO RELATED APPLICATION

This application claims priority to and the benefit of Korean Patent Application No. 10-2019-0043105, filed on Apr. 12, 2019, the content of which in its entirety is herein incorporated by reference.

BACKGROUND

1. Field

Embodiments of the present disclosure relate to a laser apparatus (e.g., for an excimer laser annealing process (ELA)), and a manufacturing method of a display apparatus using the laser apparatus.

2. Description of the Related Art

Generally, a method of crystallizing an amorphous silicon layer into a poly-crystal silicon layer includes Solid Phase Crystallization (SPC), Metal Induced Crystallization (MIC), Metal Induced Lateral Crystallization (MILC), and Excimer Laser Annealing (ELA). For example, in a manufacturing process of an organic light emitting diode display (OLED) or a liquid crystal display (LCD), the excimer laser annealing (ELA) process is used.

A laser apparatus used in such excimer laser annealing (ELA) process includes a laser generator for generating a source laser beam. The source laser beam is an unprocessed laser beam, which is laser beam having a generally rectangular shape, and whose cross section has a long axis and a short axis. The source laser beam has a Gaussian distribution of energy distribution in both a long axis direction and a short axis direction. The Gaussian distribution refers to a normal distribution that is symmetric about the average.

However, there is a case where the energy distribution of the source laser beam of the laser apparatus is uneven and deviates from the normal distribution, thereby resulting in asymmetric right and left and/or up and down. In this case, crystallization defects may occur in the polycrystalline silicon layer. Accordingly, although complex optical systems have been developed to remove the asymmetry of the source laser beam, there may be problems in that light efficiency is reduced, space is constrained, and beam alignment is difficult because a large number of optical lenses are required.

SUMMARY

One or more embodiments of the present disclosure provide a laser apparatus with simple structure and improved light efficiency.

One or more embodiments of the present disclosure also provide a manufacturing method of a display apparatus using the laser apparatus.

According to an embodiment of the present disclosure, a laser apparatus includes a laser generator configured to generate a first laser beam proceeding along a first direction, and an inversion module configured to convert the first laser beam to a second laser beam proceeding along the first direction, the inversion module including a splitter configured to form a reflected laser beam by partially reflecting the first laser beam, and a transmitted laser beam by partially transmitting the first laser beam, and a prism configured to reflect the reflected laser beam.

The second laser beam may be formed by mixing the transmitted laser beam and the reflected laser beam from the inversion module.

The inversion module may further include a first mirror configured to reflect the reflected laser beam that is reflected from the splitter, and to provide the reflected laser beam to the prism, and a second mirror configured to reflect the reflected laser beam that is reflected from the prism, and to provide the reflected laser beam to the splitter.

The inversion module may further include a first mirror that is configured to reflect the reflected laser beam that is reflected from the splitter, and a second mirror that is configured to reflect the reflected laser beam that is reflected from the first mirror toward the prism.

The inversion module may further include a first mirror that is configured to reflect the reflected laser beam that is reflected from the prism, and a second mirror that is configured to reflect the reflected laser beam that is reflected from the first mirror toward the prism, wherein the prism is configured to reflect the reflected laser beam that is reflected from the second mirror, and to provide the reflected laser beam to the splitter.

The laser apparatus may further include a first path converter that is configured to receive the second laser beam emitted from the inversion module, and to emit a third laser beam traveling in a third direction that is perpendicular to the first direction, and a second path converter that is configured to receive the third laser beam, and to emit a fourth laser beam traveling in a direction that is opposite to the first direction.

The laser apparatus may further include a laser optical system that is configured to receive the fourth laser beam, and to emit a fifth laser beam in a form of a linear laser beam.

The fifth laser beam may travel in the third direction, and may have a linear laser beam shape in a second direction that is perpendicular to the first and third directions.

The splitter of the inversion module may be configured to transmit ⅓ of a laser beam and to reflect ⅔ of the laser beam.

The reflected laser beam may be both upside down and left and right inverted with respect to the transmitted laser beam.

According to an embodiment of the present disclosure, a manufacturing method of a display apparatus includes forming an amorphous silicon thin film on a substrate, crystallizing the amorphous silicon thin film into a polycrystalline silicon thin film by irradiating a laser beam onto the amorphous silicon thin film using a laser apparatus, and forming an insulating layer, wherein the laser apparatus includes a laser generator configured to generate a first laser beam proceeding along a first direction, and an inversion module configured to convert the first laser beam to a second laser beam proceeding along the first direction, the inversion module including a splitter configured to form a reflected laser beam by partially reflecting the first laser beam, and a transmitted laser beam by partially transmitting the first laser beam, and a prism configured to reflect the reflected laser beam.

In crystallizing the amorphous silicon thin film, the second laser beam may be formed by mixing the transmitted laser beam and the reflected laser beam from the inversion module.

The inversion module of the laser apparatus may further include a first mirror that is configured to reflect the reflected laser beam that is reflected from the splitter, and to provide the reflected laser beam to the prism, and a second mirror that is configured to reflect the reflected laser beam that is reflected from the prism, and to provide the reflected laser beam to the splitter.

The laser apparatus may further include a first path converter that is configured to receive the second laser beam emitted from the inversion module, and to emit a third laser beam traveling in a third direction that is perpendicular to the first direction, and a second path converter that is configured to receive the third laser beam, and to emit a fourth laser beam traveling in a direction that is opposite to the first direction.

The laser apparatus may further include a laser optical system that is configured to receive the fourth laser beam, and to emit a fifth laser beam in a form of a linear laser beam.

The fifth laser beam may travel in the third direction, and has a linear laser beam shape in a second direction that is perpendicular to the first and third directions.

The splitter of the inversion module may be configured to transmit ⅓ of the laser beam and to reflect ⅔ of the laser beam.

The reflected laser beam may be both upside down and left and right inverted with respect to the transmitted laser beam.

According to embodiments of the present inventive concept, a laser apparatus includes a splitter and a prism, and includes an inversion module that converts a first laser beam traveling in a first direction, and that emits a second laser beam traveling along the first direction. Accordingly, the laser apparatus may form a laser beam having a uniform energy distribution through a simple structure.

It is to be understood that both the foregoing general description and the following detailed description are examples, are explanatory, and are intended to provide further explanation of the claimed embodiments.

BRIEF DESCRIPTION OF THE DRAWINGS

The above and other features of the present disclosure will become more apparent by describing in detail embodiments thereof with reference to the accompanying drawings, in which.

DETAILED DESCRIPTION

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

In the examples, first, second, and third directions are not limited to three axes of a rectangular coordinate system, and may be interpreted in a broader sense. For example, the first, second, and third directions may be perpendicular to one another, or may represent different directions that are not perpendicular to one another.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
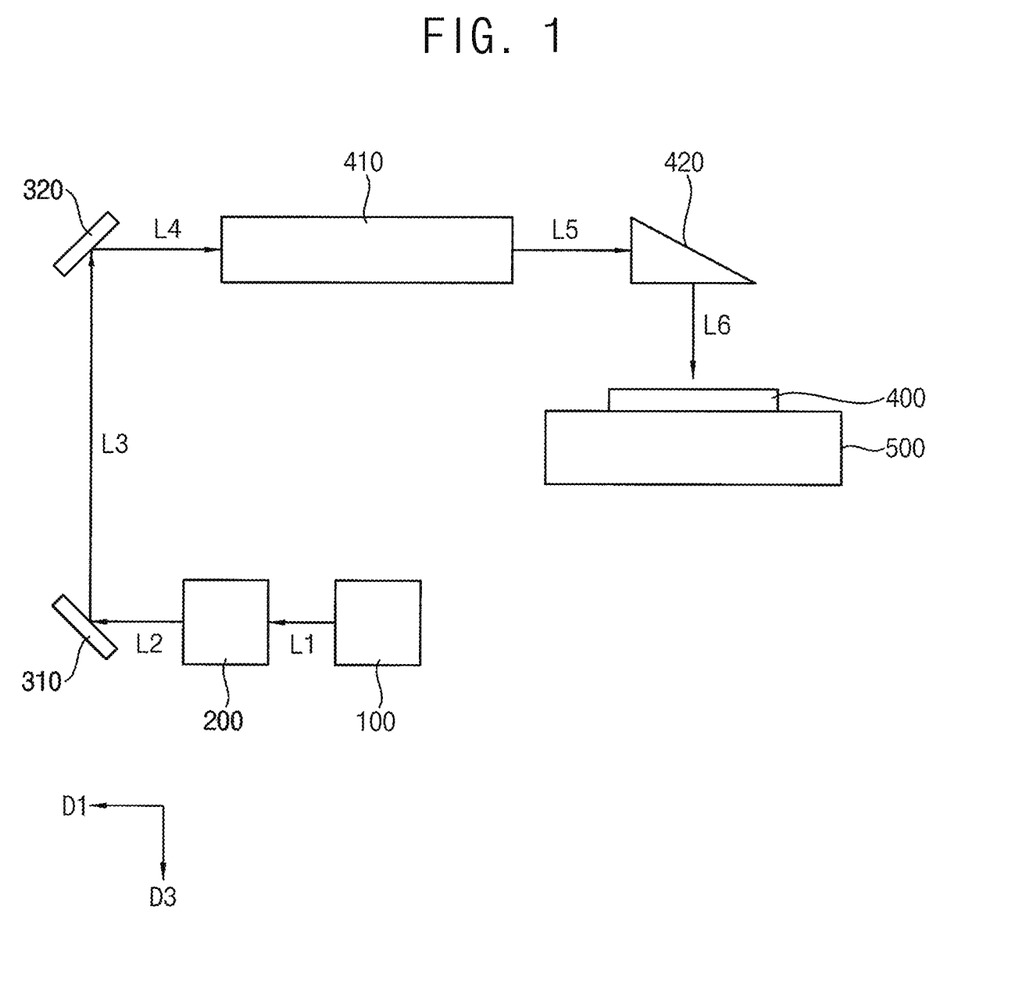
FIG. 1 is a schematic diagram illustrating a laser apparatus according to an embodiment of the present disclosure.

FIG. 1 is a schematic diagram illustrating a laser apparatus according to an embodiment of the present disclosure.

Referring to FIG. 1, the laser apparatus includes a laser generator 100, an inversion module 200, a first path converter 310, a second path converter 320, a first laser optical system 410, a second laser optical system 420, and a stage 500.

The laser generator 100 generates a laser beam to irradiate the laser beam to outside the laser generator 100. A first laser beam L1 emitted from the laser generator 100 in a first direction D1 is processed into a second laser beam L2 passing through the inversion module 200 and traveling along the first direction D1. The second laser beam L2 passes through the first path converter 310, and then proceeds as a third laser beam L3 traveling in a direction opposite to a third direction D3, which is perpendicular to the first direction D1. The third laser beam L3 passes through the second path converter 320, and is processed into a fourth laser beam L4 traveling in a direction that is opposite to the first direction D1.

The fourth laser beam L4 passes through the first laser optical system 410, and proceeds into a fifth laser beam L5. The fifth laser beam L5 passes through the second laser optical system 420, and proceeds into a sixth layer beam L6 traveling in the third direction D3. The sixth laser beam L6 may be irradiated toward an object 400 located on the stage 500 that is spaced apart from the second laser optical system 420 in the third direction D3.

The first path converter 310 and the second path converter 320 may change the path of the laser beam, and may include a mirror, a prism, or the like.

The first and second laser optical systems 410 and 420 may include an optical member such as a plurality of lenses, a mirror, and a homogenizer. The lens and mirror can change the path of the laser beam, or can process a cross-sectional shape of the laser beam, and the homogenizer can be used to make a distribution of energy of the laser beam uniform/more uniform. In this way, the sixth laser beam L6 may be processed in a form of a linear laser beam traveling in the third direction D3.

The stage 500 includes a flat upper surface, and the object 400 may be positioned on the upper surface of the stage 500. The upper surface may be parallel to a plane formed by the first direction D1 and a second direction that is perpendicular to the first direction D1 (see D2 in FIG. 2). When a thin film transistor substrate is subjected to laser annealing, the object 400 may be an amorphous silicon layer formed on a substrate.

The second laser optical system 420 may move in one direction, or may move in two directions that are perpendicular to each other. As the second laser optical system 420 moves, the laser beam can be scanned to the entire surface of the object 400. However, the present disclosure is not limited thereto. For example, instead of the second laser optical system 420 moving, the stage 500 on which the object 400 is located may be moved in a direction opposite to the one direction. As another alternative, both of the second laser optical system 420 and the stage 500 may be moved.

As described above, the laser apparatus is configured to irradiate the sixth laser beam L6 to the object 400 to allow for crystallization of amorphous silicon into poly-crystalline silicon, which will be described later with reference to FIG. 7.

In addition, in FIGS. 3 and 4, an inversion module 200 for converting the first laser beam L1 emitted from the laser generator 100 into the second laser beam L2, will be described in detail.

Figure 2:
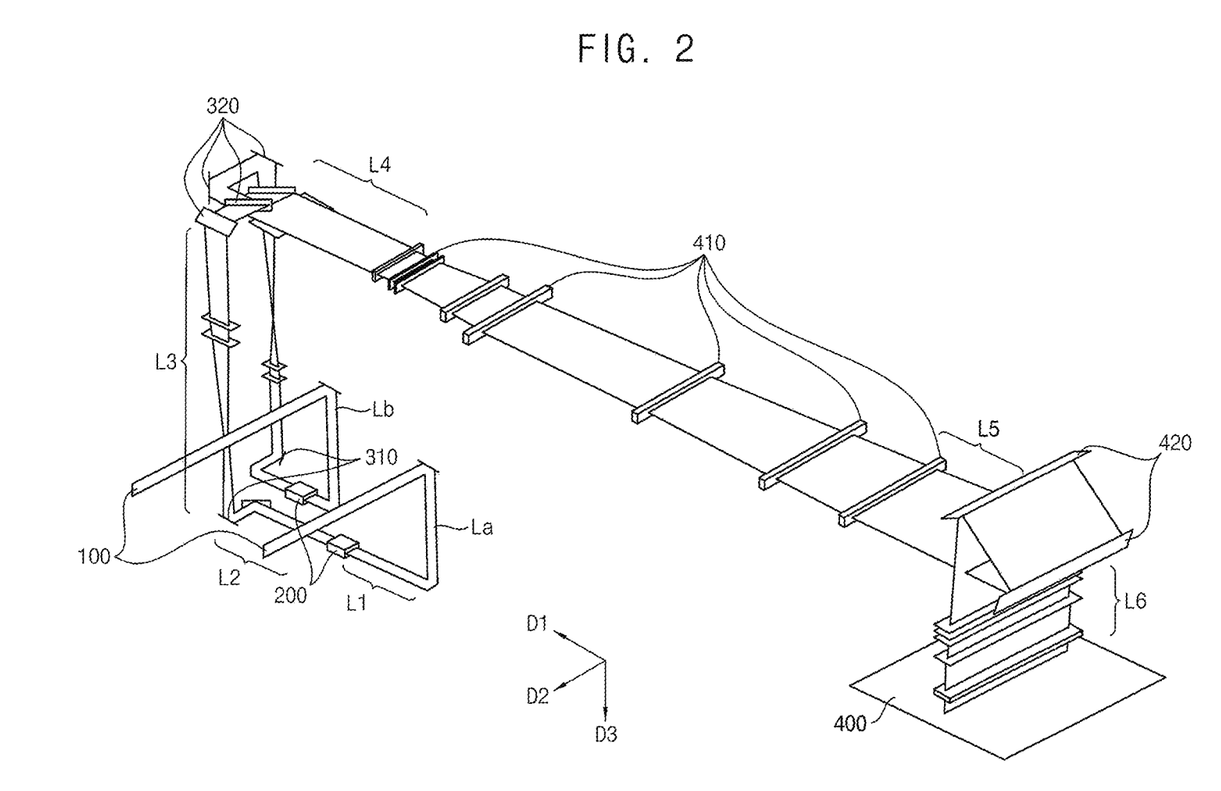
FIG. 2 is a diagram illustrating an embodiment of the laser apparatus of FIG. 1.

FIG. 2 is a diagram illustrating an embodiment of the laser apparatus of FIG. 1.

Referring to FIG. 2, the laser apparatus includes a laser generator 100, an inversion module 200, a first path converter 310, a second path converter 320, a first laser optical system 410, a second laser optical system 420 and a stage.

In addition, the laser apparatus may include two laser generators 100, and may have a structure in which two laser beams La and Lb are mixed. Accordingly, the inversion module 200 may also be installed (e.g., as a plurality) to be in each path of the two laser beams La and Lb.

Figure 3:
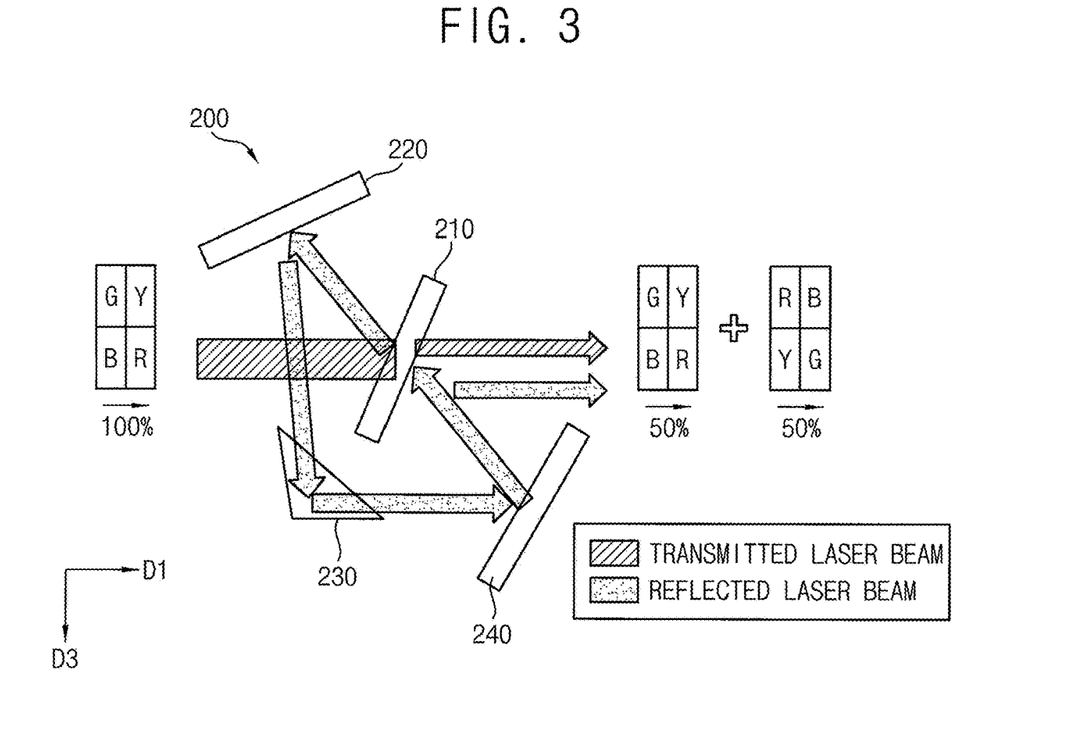
FIG. 3 is a detailed explanatory diagram of an inversion module of the laser apparatus of FIG. 1.
Figure 4:
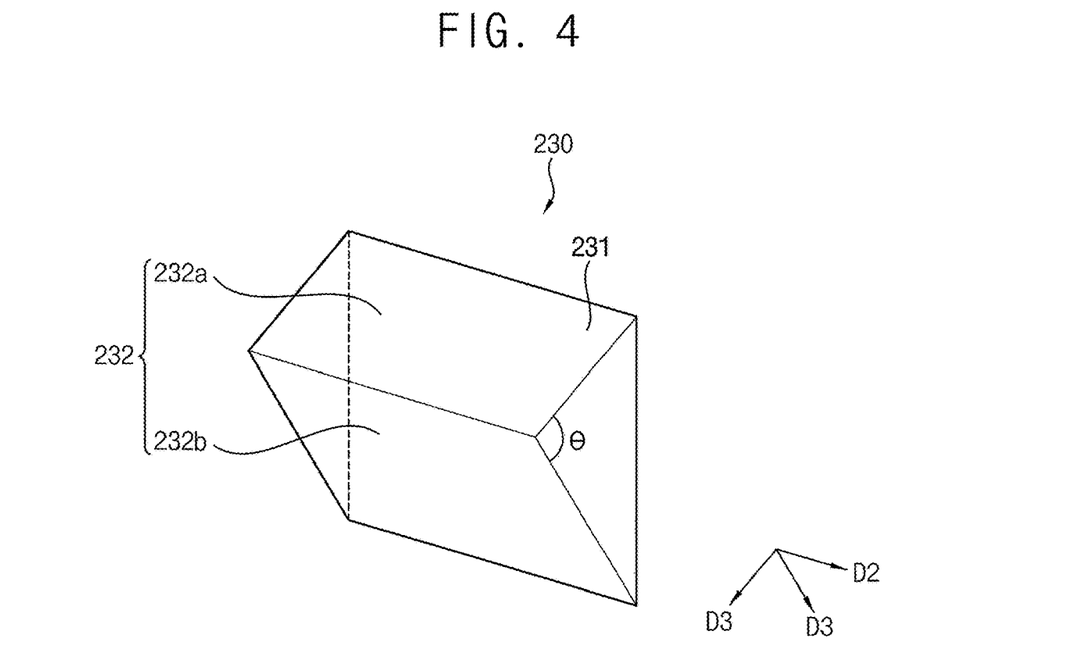
FIG. 4 is a perspective view illustrating a prism 230 of the inversion module of FIG. 3.

FIG. 3 is a detailed explanatory diagram of an inversion module of the laser apparatus of FIG. 1. FIG. 4 is a perspective view illustrating a prism 230 of the inversion module of FIG. 3.

Referring to FIGS. 1 to 4, the inversion module 200 may include a splitter 210, a first mirror 220, a prism 230, and a second mirror 240.

The splitter 210 partially reflects the incident first laser beam L1 to make a reflected laser beam with a portion of the first laser beam L1, and a remainder of the first laser beam L1 passes through the splitter 210, and is processed into a transmitted laser beam. For example, the splitter 210 reflects two thirds of the incident first laser beam L1 to form the reflected laser beam, and transmits the remaining one third of the incident laser beam L1 to form the transmitted laser beam.

The first mirror 220 may reflect the reflected laser beam from the splitter 210 to make the reflected laser beam travel to the prism 230.

The prism 230 may include an incident surface 231 and a reflective surface 232. The reflective surface 232 may include a first inclined surface 232a and a second inclined surface 232b. The first inclined surface 232a and the second inclined surface 232b may be arranged to form a first angle θ in a cross section formed along the first direction D1 and third direction D3. An edge may be formed where the first inclined surface 232a and the second inclined surface 232b meet together. Here, the first angle θ may be smaller than 180 degrees.

The reflected laser beam that is reflected from the first mirror 220 is incident through the incident surface 231 of the prism 230, is reflected on the reflective surface 232, and exits through the incident surface 231. The reflected laser beam emitted through the incident surface 231 is reflected by the second mirror 240 to proceed to the splitter 210. The reflected laser beam reflected on the second mirror 240 is reflected again by the splitter 210, and is mixed with the transmitted laser beam to form the second laser beam L2

In this case, a part of the reflected laser beam that is reflected by the second mirror 240 may be transmitted through the splitter 210 without being reflected by the splitter 210, and proceeds to the first mirror 220. For example, two thirds of the reflected laser beam that is reflected by the second mirror 240 may be reflected by the first splitter 210, and one third may be transmitted through the splitter 210. Meanwhile, the reflected laser beam that is transmitted may pass through/along the first mirror 220, the prism 230, and the second mirror 240 to be reflected and transmitted again at the splitter 210. This is repeated to finally achieve 50% uninverted, or non-inverted, laser beam and 50% inverted laser beam. These may be mixed to form the second laser beam L2 having a uniform energy distribution. In this case, the first laser beam L1 and the second laser beam L2 may have the same traveling direction (first direction D1).

Hereinafter, a path of the laser beam in the inversion module 200 will be described in more detail.

For convenience of explanation, assume that green G is at an upper left of the first laser beam L1 before entering the splitter 210, yellow Y is at an upper right, blue B is at a lower left, and red R is at a lower right.

The transmitted laser beam emitted from the splitter 210 may have the same distribution as the first laser beam L1 before entering the splitter 210. That is, the transmitted laser beam has green G at the upper left, yellow Y at the upper right, blue B at the lower left, and red R at the lower right.

On the other hand, the reflected laser beam reflected by the splitter 210 and exits through the first mirror 220, the prism 230 and the second mirror 240 may be reversed up and down, and left and right. That is, the transmitted laser beam has red R at the upper left, blue B at the upper right, yellow Y at the lower left, and green G at the lower right.

Accordingly, the second laser beam may include the non-inverted transmitted laser beam and the reflected laser beam inverted up and down and left and right, which are mixed together. Thus even when the energy distribution of the first laser beam L1 is not uniform, the energy distribution of the second laser beam L2 can be made uniform to have a normal distribution that is symmetrical.

Accordingly, according to the present embodiment, an origin reversal module can be configured through a simple structure. Therefore, the light efficiency can be improved (e.g., see FIG. 8)

In addition, by adjusting a transmittance of the splitter 210, it is possible to adjust a ratio of the reflected laser beam and the transmitted laser beam. Through this, the transmittance, at which the energy distribution of the second laser beam L2 is improved or optimized, may be determined.

In addition, the first laser beam and the second laser beam are located on the same straight line, thereby facilitating alignment of the laser beam of the laser apparatus.

According to the present embodiment, the inversion module 200 of the laser apparatus may configure the origin inversion module through a relatively simple structure compared to the prior art, the ratio of the transmitted laser beam that is not inverted and the reflected laser beam that is inverted can be easily set by adjusting the transmittance of the splitter 210

In addition, because the first laser beam L1 incident into the inversion module 200 and the second laser beam L2 emitted from the inversion module 200 travel in the same direction, the inversion module 200 may be located between the laser generator 100 and the first path converter 310. Accordingly, space layout efficiency of the components of the laser apparatus can be improved.

Figure 5:
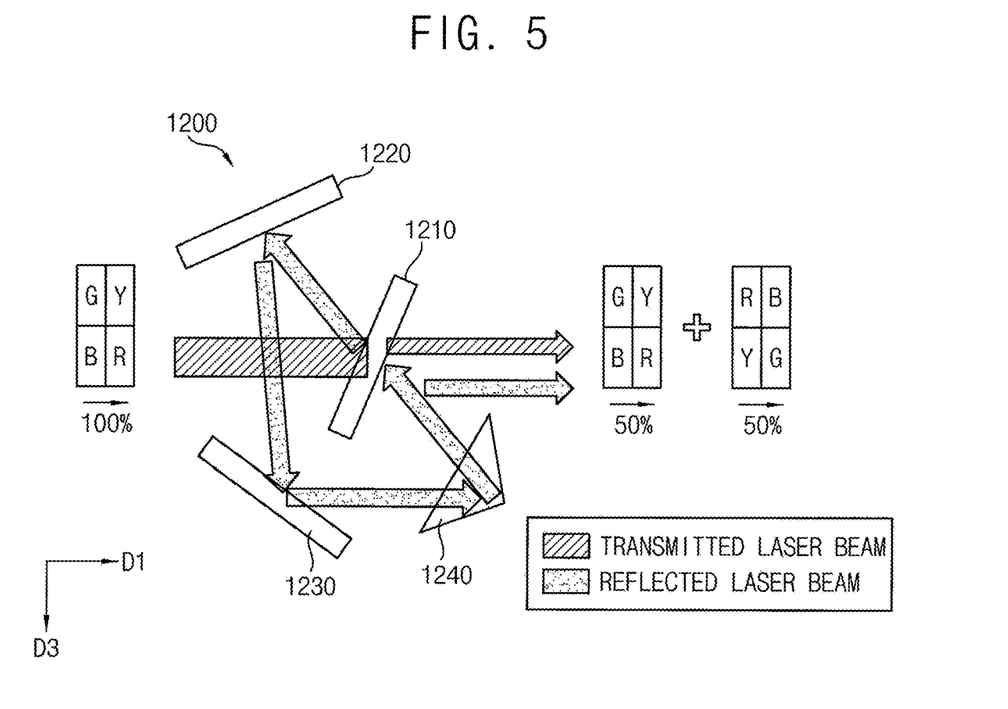
FIG. 5 is a detailed explanatory diagram of the inversion module of the laser apparatus according to another embodiment of the present disclosure.

FIG. 5 is a detailed explanatory diagram of the inversion module of the laser apparatus according to another embodiment of the present disclosure.

Referring to FIG. 5, an inversion module 1200 of the laser apparatus is substantially the same as the inversion module 200 of the laser apparatus of FIG. 3 except for positions of the second mirror 1230 and the prism 1240. Therefore, repeated description will be omitted.

The inversion module 1200 may include a splitter 1210, a first mirror 1220, a second mirror 1230, and a prism 1240.

The splitter 1210 partially reflects a first laser beam to form a reflected laser beam, and partially transmits the first laser beam to form a transmitted laser beam.

The first mirror 1220 may reflect the reflected laser beam that is reflected from the splitter 1210 to make the reflected laser beam travel to the second mirror 1230.

The second mirror 1230 may reflect the reflected laser beam that is reflected from the first mirror 1220 to make the reflected laser beam travel to the prism 1240.

The reflected laser beam reflected by the prism 1240 is reflected back to the splitter 1210, and a portion thereof may be then reflected by the splitter 1210, and may be mixed with the transmitted laser beam to form a second laser beam. Also, in this case, a portion of the reflected laser beam may be transmitted back to the first mirror 1220 without being reflected by the splitter 1210.

Figure 6:
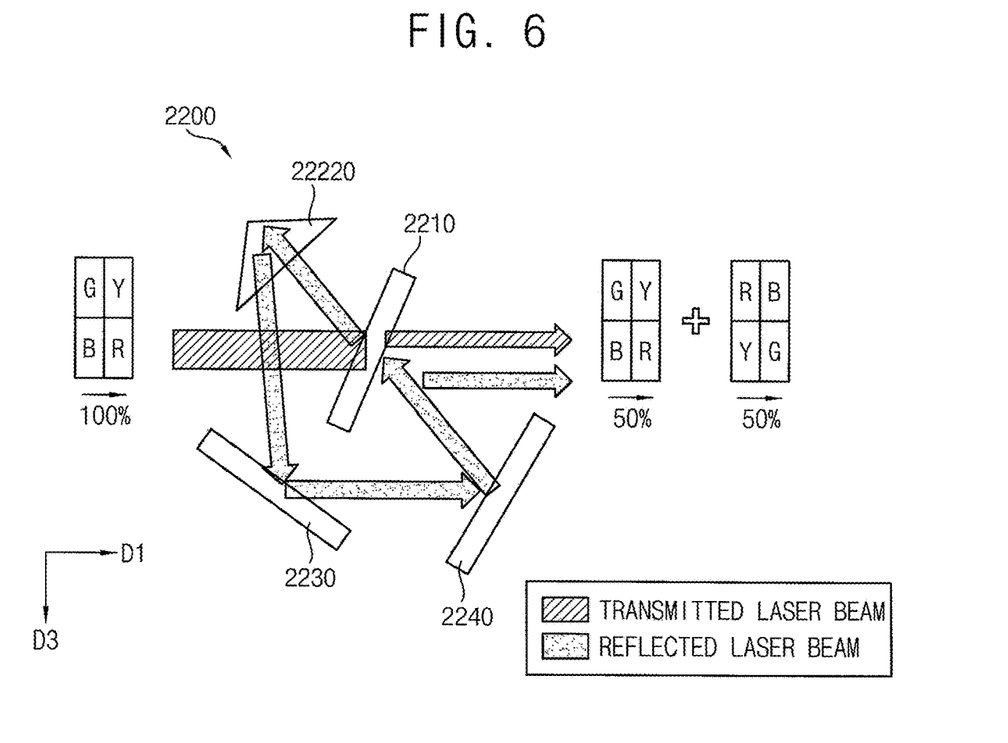
FIG. 6 is a detailed explanatory diagram of the inversion module of the laser apparatus according to another embodiment of the present disclosure.

FIG. 6 is a detailed explanatory diagram of the inversion module of the laser apparatus according to another embodiment of the present disclosure.

Referring to FIG. 6, the inversion module 2200 of the laser apparatus is substantially the same as the inversion module 200 of the laser apparatus of FIG. 3 except for positions of the first mirror 2230, the second mirror 2240, and the prism 2220. Therefore, repeated description will be omitted.

The inversion module 2200 may include a splitter 2210, a prism 2220, a first mirror 2230, and a second mirror 2240.

The splitter 2210 partially reflects a first laser beam to form a reflected laser beam, and partially transmits the first laser beam to form a transmitted laser beam.

The prism 2220 may reflect the reflected laser beam that is reflected from the splitter 2210 to make the reflected laser beam travel to the first mirror 2230.

The first mirror 2230 may reflect the reflected laser beam that is reflected from the prism 2220 to make the reflected laser beam travel to the second mirror 2240. The reflected laser beam reflected by the second mirror 2240 is reflected by the splitter 2210 again (e.g., partially reflected), and is then mixed with the transmitted laser beam to form a second laser beam.

In this case, a portion of the reflected laser beam may be transmitted back to the prism 2220 without being reflected by the splitter 2210.

Figure 7:
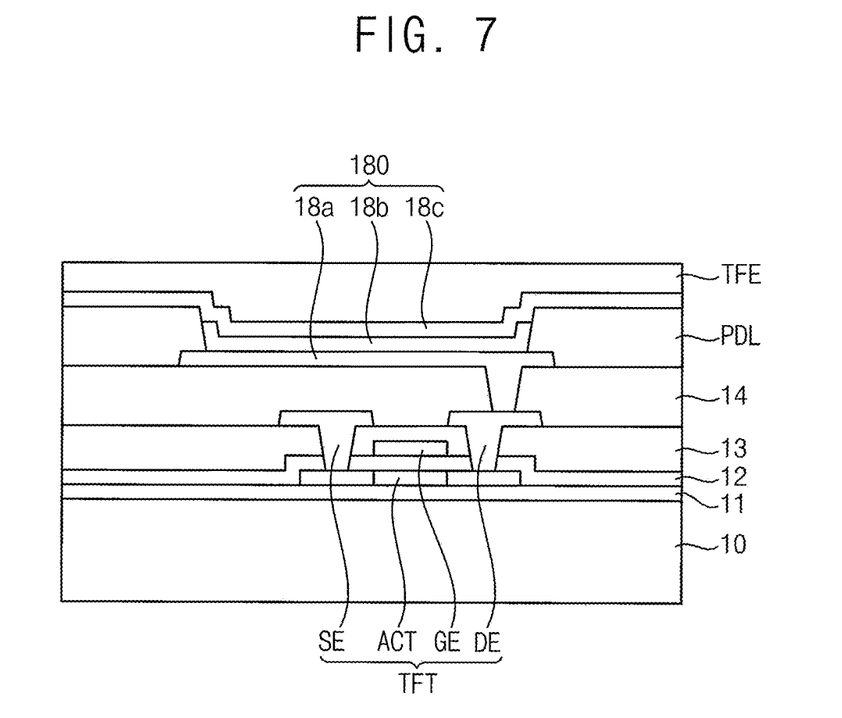
FIG. 7 is a cross-sectional view of a display apparatus manufactured by a display apparatus manufacturing method according to an embodiment of the present disclosure.

FIG. 7 is a cross-sectional view of a display apparatus manufactured by a display apparatus manufacturing method according to an embodiment of the present disclosure.

Referring to FIG. 7, the display apparatus may include a base substrate 10, a buffer layer 11, an active pattern ACT, a first insulating layer 12, a gate electrode GE, a second insulating layer 13, a source electrode SE, a drain electrode DE, a via insulating layer 14, a pixel defining layer PDL, a light emitting structure 180, and a thin film encapsulation layer TFE.

The base substrate 10 including transparent or opaque insulation materials may be provided. For example, the base substrate 10 may include a quartz substrate, a synthetic quartz substrate, a calcium fluoride substrate, a fluoride-doped quartz substrate, a sodalime glass substrate, a non-alkali glass substrate etc. Alternatively, the base substrate 10 may include a flexible transparent material such as a flexible transparent resin substrate. An example of the transparent resin substrate for the base substrate 10 may be a polyimide substrate.

The buffer layer 11 may be located on the entire base substrate 10. The buffer layer 11 may prevent the diffusion of metal atoms and/or impurities from the base substrate 10 into the active pattern ACT. In addition, the buffer layer 110 may control a rate of a heat transfer in a crystallization process for forming the active pattern ACT, thereby obtaining substantially uniformity of the active pattern ACT. In addition, the buffer layer 11 may improve flatness of a surface of the base substrate 10 when the surface of the base substrate 10 is not uniform.

The active pattern ACT may be located on the buffer layer 11. The active pattern ACT may include polycrystalline silicon. The active pattern ACT may include drain and source regions doped with an impurity, and a channel region between the drain region and the source region. The polycrystalline silicon may be formed by first depositing amorphous silicon and then crystallizing it. Here, a laser apparatus according to an embodiment of the present disclosure can be used.

The first insulating layer 12 may cover the active pattern ACT on the buffer layer 11, and may have a substantially uniform thickness along a profile of the active pattern ACT. Alternatively, the first insulating layer 12 may sufficiently cover the active pattern ACT on the buffer layer 11, and may have a substantially flat upper surface without a step near the active pattern ACT. The first insulating layer 12 may include an inorganic insulating material, such as a silicon compound or a metal oxide.

A gate pattern including the gate electrode GE may be located on the first insulating layer 12. The gate pattern may further include a signal line such as a gate line for driving the display apparatus. The gate pattern may be formed using a metal, an alloy, a metal nitride, a conductive metal oxide, a transparent conductive material, or the like.

The second insulating layer 13 may be located on the first insulating layer 12 on which the gate pattern is located. The second insulating layer 13 may cover the gate pattern on the first insulating layer 12, and may have a substantially uniform thickness along a profile of the gate pattern. Alternatively, the second insulating layer 13 may sufficiently cover the gate pattern on first insulating layer 12, and may have a substantially flat upper surface without forming a step around the gate pattern. The second insulating layer 13 may include an inorganic insulation material, such as a silicon compound or a metal oxide.

A data pattern including the source electrode SE and the drain electrode DE may be located on the second insulating layer 13. The data pattern may further include a signal line such as a data line for driving the display apparatus. The data pattern may be formed using a metal, an alloy, a metal nitride, a conductive metal oxide, a transparent conductive material, or the like.

The active pattern ACT, the gate electrode GE, the source electrode SE, and the drain electrode DE may be included in a thin film transistor TFT.

The via insulating layer 14 may be located on the second insulating layer 13 on which the data pattern is located. The via insulating layer 14 may have a single-layer structure, or may have a multi-layer structure including at least two insulating layers. The via insulating layer 14 may be formed using an organic material such as a photoresist, an acrylic resin, a polyimide resin, a polyamide resin, or a siloxane-based resin.

The light emitting structure 180 may include a first electrode 18a, an emission layer 18b and a second electrode 18c.

The first electrode 18a may be located on the via insulating layer 14. The first electrode 18a may include a reflective material or a transmissive material in accordance with the emission type of the display apparatus. In embodiments, the first electrode 18a may have a single-layer structure or a multi-layer structure, which may include a metal film, an alloy film, a metal nitride film, a conductive metal oxide film and/or a transparent conductive film.

The pixel defining layer PDL may be located on the via insulating layer 14 on which the first electrode 18a is located. The pixel defining layer PDL may be formed using an organic material. For example, the pixel defining layer PDL may include photoresist, acryl-based resin, polyimide-based resin, polyamide-based resin, siloxane-based resin, etc. In some embodiments, an opening that exposes the first electrode 18a may be formed by etching the pixel defining layer PDL. An emitting area and a non-emitting area of the display apparatus may be defined by the opening of the pixel defining layer PDL. For example, a portion where the opening of the pixel defining layer PDL is located may correspond to an emitting area, and a non-emitting area may correspond to a portion adjacent to the opening of the pixel defining layer PDL.

The light emitting layer 18b may be located on the first electrode 18a exposed through the opening of the pixel defining layer PDL. In addition, the light emitting layer 18b may extend on a sidewall of the opening of the pixel defining layer PDL. In some embodiments, the light emitting layer 18b may include an organic light emitting layer (EL), a hole injection layer (HIL), a hole transfer layer (HTL), an electron transfer layer (ETL), an electron injection layer (EIL), etc. In some embodiments (except for the organic emission layer) the hole injection layer, the hole transport layer, the electron transport layer, and the electron injection layer may be respectively formed in common to correspond to a plurality of pixels. In some embodiments, a plurality of organic light emitting layers may be formed using light emitting materials for generating different colors of light, such as a red color of light, a green color of light, and a blue color of light, in accordance with color pixels of the display device. In some embodiments, the organic light emitting layer of the of the light emitting layer 18b may include a plurality of stacked light emitting materials for generating a red color of light, a green color of light, and a blue color of light to thereby emit a white color of light. Here, elements of the light emitting layer 18b are commonly formed so as to correspond to a plurality of pixels, and each pixel can be divided by a color filter layer.

The second electrode 18c may be located on the pixel defining layer PDL and the light emitting layer 18b. The second electrode 18c may include a transmissive material or a reflective material in accordance with the emission type of the display device. In embodiments, the second electrode 18c may also have a single-layer structure or a multi-layer structure, which may include a metal film, an alloy film, a metal nitride film, a conductive metal oxide film and/or a transparent conductive film.

The thin film encapsulation layer TFE may be located on the second electrode 18c. The thin film encapsulation layer TFE may reduce or prevent penetration of moisture and oxygen from outside. The thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween, but is not limited thereto. In some embodiments, it is possible to provide a sealing substrate for shielding outside air and moisture from penetrating into the display apparatus instead of the thin film encapsulation layer TFE.

Meanwhile, the structure of the display apparatus illustrated in FIG. 7 is merely an example, and may be variously modified according to a design.

Figure 8:
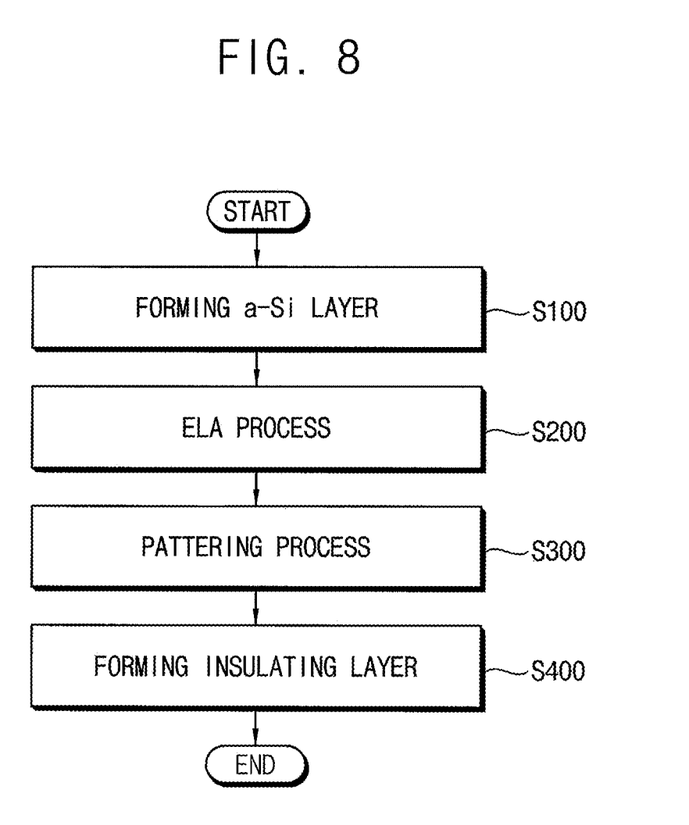
FIG. 8 is a flowchart illustrating a display apparatus manufacturing method according to an embodiment of the present disclosure.

FIG. 8 is a flowchart illustrating a display apparatus manufacturing method according to an embodiment of the present disclosure.

The manufacturing method of the display apparatus may include forming an a-Si layer (S100), an ELA process (S200), a patterning process (S300), and forming an insulating layer (S400).

In forming the a-Si layer (S100), an amorphous silicon thin film may be formed on the base substrate. The base substrate may include a transparent polyimide layer.

In the ELA process (S200), by using a laser apparatus according to the embodiments of the present disclosure, by irradiating a laser beam to the amorphous silicon thin film, it is possible to form a polycrystalline silicon (polysilicon) thin film. Detailed description thereof is as described above.

In the patterning process (S300), the polycrystalline silicon layer may be patterned to form an active pattern. In forming the insulating layer (S400), an insulating layer may be formed on the active pattern.

Thereafter, a gate electrode, a second insulating layer, a source electrode, a drain electrode, a via insulating layer, a first electrode, a pixel defining layer, a light emitting layer, a second electrode, and a thin film encapsulation layer are sequentially formed on the insulating layer. The components may be formed according to known general methods, and detailed description thereof will be omitted.

Figure 9:
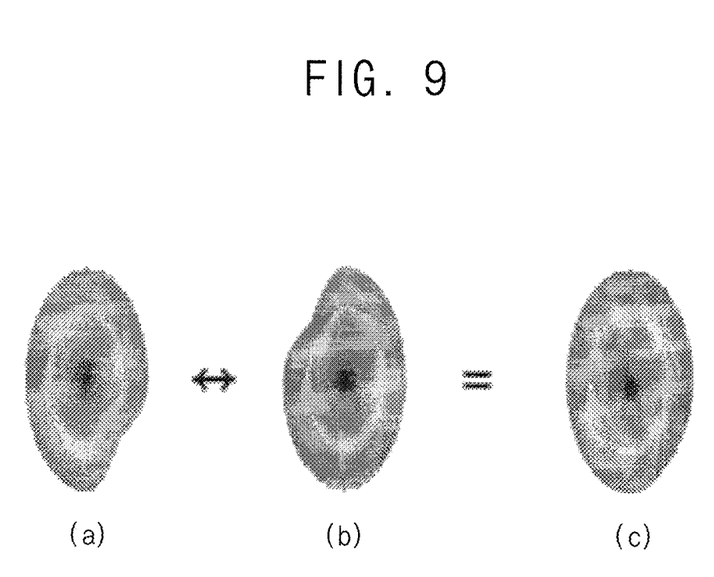
FIG. 9 is a view for explaining asymmetry improvement of a laser beam using an inversion module of a laser apparatus according to an embodiment of the present disclosure.

FIG. 9 is a view for explaining asymmetry improvement of a laser beam using an inversion module of a laser apparatus according to an embodiment of the present disclosure.

Referring to FIG. 9, although the inversion module has an asymmetry in the transmitted laser beam (a), the reflective laser beam (b) has an origin inversion (vertical inversion and left and right inversion) with respect to the transmitted laser beam (a). As a result, the mixed laser beam (c) of the transmitted laser beam (a) and the reflected laser beam (b) may have a substantially uniform energy distribution.

The present disclosure can be applied to manufacture organic light emitting display devices and various electronic devices including the same. For example, the present disclosure can be applied to manufacture a mobile phone, a smart phone, a video phone, a smart pad, a smart watch, a tablet PC, a car navigation system, a television, a computer monitor, a notebook, and the like.

The foregoing is illustrative of the present disclosure, and is not to be construed as limiting thereof. Although a few embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures and functional equivalents. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The inventive concept is defined by the following claims, with equivalents of the claims to be included therein.

What is claimed is:

1. A laser apparatus, comprising:
   a laser generator configured to generate a first laser beam proceeding along a first direction from the laser generator toward a target; and
   an inversion module configured to convert the first laser beam to a second laser beam proceeding along the first direction toward the target, the inversion module comprising:
      a splitter configured to form a reflected laser beam by partially reflecting the first laser beam, and a transmitted laser beam by partially transmitting the first laser beam, the splitter being between the laser generator and the target in the first direction; and
      a prism configured to reflect the reflected laser beam.

2. The laser apparatus of claim 1, wherein the second laser beam is formed by mixing the transmitted laser beam and the reflected laser beam from the inversion module.

3. The laser apparatus of claim 2, wherein the inversion module further comprises:
   a first mirror configured to reflect the reflected laser beam that is reflected from the splitter, and to provide the reflected laser beam to the prism; and
   a second mirror configured to reflect the reflected laser beam that is reflected from the prism, and to provide the reflected laser beam to the splitter.

4. The laser apparatus of claim 2, wherein the inversion module further comprises:
   a first mirror that is configured to reflect the reflected laser beam that is reflected from the splitter; and
   a second mirror that is configured to reflect the reflected laser beam that is reflected from the first mirror toward the prism.

5. The laser apparatus of claim 2, wherein the inversion module further comprises:
   a first mirror that is configured to reflect the reflected laser beam that is reflected from the prism; and
   a second mirror that is configured to reflect the reflected laser beam that is reflected from the first mirror toward the prism, and
   wherein the prism is configured to reflect the reflected laser beam that is reflected from the second mirror, and to provide the reflected laser beam to the splitter.

6. A laser apparatus, comprising:
   a laser generator configured to generate a first laser beam proceeding along a first direction;
   an inversion module configured to convert the first laser beam to a second laser beam proceeding along the first direction, the inversion module comprising:
      a splitter configured to form a reflected laser beam by partially reflecting the first laser beam, and a transmitted laser beam by partially transmitting the first laser beam; and
      a prism configured to reflect the reflected laser beam;
   a first path converter that is configured to receive the second laser beam emitted from the inversion module, and to emit a third laser beam traveling in a third direction that is perpendicular to the first direction; and
   a second path converter that is configured to receive the third laser beam, and to emit a fourth laser beam traveling in a direction that is opposite to the first direction.

7. The laser apparatus of claim 6, further comprising a laser optical system that is configured to receive the fourth laser beam, and to emit a fifth laser beam in a form of a linear laser beam.

8. The laser apparatus of claim 7, wherein the fifth laser beam travels in the third direction, and has a linear laser beam shape in a second direction that is perpendicular to the first and third directions.

9. The laser apparatus of claim 1, wherein the splitter of the inversion module is configured to transmit ⅓ of a laser beam and to reflect ⅔ of the laser beam.

10. The laser apparatus of claim 1, wherein the reflected laser beam is both upside down and left and right inverted with respect to the transmitted laser beam.

* * * * *